United States Patent
Taniguchi et al.

(10) Patent No.: US 7,859,934 B2
(45) Date of Patent: Dec. 28, 2010

(54) METHOD AND APPARATUS FOR REDUNDANT MEMORY CONFIGURATION IN VOLTAGE ISLAND

(75) Inventors: Masayoshi Taniguchi, Shiga-ken (JP); Isamu Mashima, Shiga-ken (JP); Jun Usami, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 12/330,936

(22) Filed: Dec. 9, 2008

(65) Prior Publication Data
US 2009/0097335 A1 Apr. 16, 2009

Related U.S. Application Data

(63) Continuation of application No. 11/275,247, filed on Dec. 20, 2005, now Pat. No. 7,477,564.

(30) Foreign Application Priority Data

Dec. 20, 2004 (JP) ............................. 2004-367038

(51) Int. Cl.
*G11C 17/18* (2006.01)
(52) U.S. Cl. ..................... 365/225.7; 365/240; 365/200
(58) Field of Classification Search ............ 365/189.12, 365/225.7, 240, 200, 230.03, 96, 230.06, 365/189.03, 189.08
See application file for complete search history.

(56) References Cited

U.S. PATENT DOCUMENTS 6,084,803 A 7/2000 Sredanovic et al.
6,353,570 B2 * 3/2002 Hwang et al. ............ 365/225.7
6,768,694 B2 * 7/2004 Anand et al. ............. 365/225.7

(Continued)

FOREIGN PATENT DOCUMENTS

JP 4026999 1/1992

(Continued)

OTHER PUBLICATIONS

Office Action from U.S. Appl. No. 11/275,247, dated Jul. 2, 2008.

(Continued)

*Primary Examiner*—Dang T Nguyen
(74) *Attorney, Agent, or Firm*—Shimokaji & Associates, P.C.

(57) ABSTRACT

A method and apparatus to configure redundant memory elements in a system on a chip (SoC) having discrete voltage domains (islands). A plurality of memories are provided for each voltage island, each containing redundancy elements or having the capability to access redundant memory elements in a neighboring voltage domain; a fuse cell stores configuration information for controlling the switching of memory elements of the plurality of memories; a shift register receives and retains configuration information on a memory array from the fuse cell corresponding to each memory; and a control circuit directs operation of the shift register. The shift register includes a shift portion for receiving the data of the configuration information and transferring the data to another shift register, and a latch portion for retaining the data inputted to the shift portion. The control circuit controls whether or not the data of the shift register, which is inputted to the shift portion, is to be retained in the latch portion.

4 Claims, 10 Drawing Sheets

U.S. PATENT DOCUMENTS

| | | | |
|---|---|---|---|
| 6,798,272 | B2 | 9/2004 | Lehmann |
| 6,963,511 | B2 | 11/2005 | Ashizawa |
| 7,477,564 | B2 * | 1/2009 | Taniguchi et al. ........ 365/225.7 |
| 2005/0076274 | A1 * | 4/2005 | Nagai et al. .................. 714/718 |

FOREIGN PATENT DOCUMENTS

| | | |
|---|---|---|
| JP | 7320495 | 12/1995 |
| JP | 2002-261599 | 9/2002 |
| JP | 2003-109395 | 4/2003 |
| JP | 2004-133970 | 4/2004 |

OTHER PUBLICATIONS

Notice of Allowance from U.S. Appl. No. 11/275,247, dated Sep. 9, 2008.

* cited by examiner

METHOD AND APPARATUS FOR REDUNDANT MEMORY CONFIGURATION IN VOLTAGE ISLAND

BACKGROUND OF THE INVENTION

The present invention relates to a microcomputer configured in a single chip, which is provided with a plurality of modules activated by causing power to be supplied from an independent power source, and particularly relates to the control over its memories.

As the integration of an LSI device progresses, a chip configuring a system on silicon that is, a LSI called a System on Chip (SoC) has been realized.

The SoC often includes a memory inside the chip. With increasing storage capacity of the SoC memory, redundancy schemes implemented in the memory are instrumental in improving chip manufacturing yields (for example, refer to Japanese Patent Application Laid-open No. Hei 7-320495 and incorporated herein by reference). Accordingly, when a failure is found in an installed memory element during manufacturing test of the SoC, the defective memory elements are replaced with redundant memory elements (redundant bits). The replacement of memory elements is achieved by programming a fuse buried in the chip by a laser or by applying a programming current in the case of an eFuse.

Unlike a general-purpose memory, the SoC generally incorporates a variety of memory types. Therefore, when employing a configuration of one fuse for one memory element, the number of fuses increases dramatically and commensurately with the total chip area dedicated to redundancy fusing. Hence, employed is conventionally a configuration to realize a configuration (a control over replacement with redundancy memory elements) of a memory, where information for the redundancy of all memories inside a chip (configuration information) is stored in one fuse cell, and where the configuration information is propagated to each memory. Furthermore, as a data amount increases, the compression efficiency of data generally becomes more robust.

Accordingly, integrating fuse data (configuration information) in one cell can increase the efficiency of the data compression more than storing the fuse data in separate fuses.

FIG. 8 shows a schematic view of a configuration of a conventional SoC.

In an example shown in FIG. 8, all memories in a chip (data cache 812 and program cache 813 of module 810 and data cache 822 and program cache 823 of module 820) can switch a memory element to a redundancy memory element by the control of single fuse cell 801. In FIG. 8, configuration data stored in fuse cell 801 is compressed to reduce the total volume of configuration data. When turning on SoC 800, the compressed data is output from fuse cell 801 by Power on Reset, thus being decompressed by decompression 802.

Conversely, in the SoC of FIG. 8, each memory including a dynamic random access memory (DRAM) 803 is provided with shift registers (flip-flop circuits) depicted in FIG. 9. Further, the shift registers of the respective memories are connected together forming a scan chain. Moreover, the decompressed configuration data is propagated to DRAM 803 and each memory of the modules 810 and 820 by the scan chain.

Incidentally, an application specific integrated circuit (ASIC) designed and manufactured for a specific purpose, which is realized as a SoC, may have a power-saving design called a voltage island to reduce the power consumption as disclosed, for example, in "Design System Voltage Island", IBM Japan, available at http:www-6.ibm.com/jp/chips/products/asics/products/v_island.html and incorporated herein by reference. In a voltage island based SoC architecture, a circuit in an ASIC is divided into a plurality of modules, thus making it possible to independently switch on and off the respective modules for which a power source is required. Then, by turning off a module which is not being used, the leakage current of the module can be eliminated. A cell phone operated in a standby mode, for example, may supply power only to those modules necessary for maintaining standby mode operation and turn off the power of a large unneeded part of a circuit with this technique. In this regard, it is possible to dramatically improving battery life of mobile devices by suppressing leakage current of an ASIC as much as possible.

In the SoC shown in FIG. 8, modules 810 and 820 represent discrete areas of the SoC with different voltage domains or voltage islands, respectively. Power is independently supplied from power source VDD1 to module 810, and from power source VDD2 to module 820 (in practice, the independent power sources VDD1 and VDD2 are realized by supplying power to the respective modules 810 and 820 from a power source VDD common to the whole SoC through independent switches). Hence, it is possible to turn off one of the modules 810 and 820 and activate the other independently, by turning off one of the power sources VDD1 and VDD2.

As described above, a voltage island with memory array redundancy and a power-saving design is realized in a SoC. However, when memory array redundancy is implemented on a SoC with different voltage islands, the following problems arise.

First, when turning on the whole SoC, all memories do not have information on a redundant circuit in an initial state. Therefore, a fuse/decompression module (i.e. fuse cell 801 and decompression 802 of FIG. 8) is initialized by Power on Reset.

Consequently, the data stored in fuse cell 801 is decompressed by the decompression 802, thus propagating the data to each memory by the scan chain. When finishing the transfer, the configuration of a memory is completed as shown in FIG. 10, thus reaching a state where a central processing unit (CPU) can access a memory.

If the function of module 820 becomes unnecessary shortly after turning on the power supplying the SoC, the power source VDD2 of module 820 is turned off to reduce power consumption. At this point, since the power supply is cut in module 820, the memory configuration information (the data cache 822 and the program cache 823) included in the module 820 is lost.

When an application using module 820 is thereafter executed, the power source VDD2 of module 820 is turned on again. However, since the configuration information on the memories residing in module 820 is lost, a fuse/decompression module must be initialized again to use the memories. Thus, the configuration information saved in the memories of module 820 must be propagated by the scan chain.

However, if the configuration information is propagated by this scan chain, the configuration information on the memories (the data cache 812 and the program cache 813) of module 810 is simultaneously rewritten. Hence, it temporarily becomes impossible to access the memories (including the DRAM 803) by a CPU 811 also in the module 810 until the configuration information is transferred by the scan chain.

A method implementing a fuse/decompression module for each domain can be considered. If there is a fuse/decompression module for each domain (module), the influence of the propagation of the configuration information does not affect any modules except for those that are currently being supplied power. Therefore, when module 820 is turned on as described above, the operations of module 810 are not disabled. However, such a configuration leads to an increase in the total area of a chip since a plurality of fuse/decompression modules which occupy an extremely large area on the chip are provided, and also since the effect of compressing data retained by fuse cells weakens due to the scattering of the fuse cells.

SUMMARY OF THE INVENTION

An object of the present invention is therefore to provide a means for avoiding a condition where memories cannot be accessed in another module upon turning on a predetermined module in a voltage island without providing a fuse cell for each voltage domain (module).

The present invention to achieve the foregoing object is realized as the following microcomputer configured in a single chip. This microcomputer includes: a plurality of memories with redundancy elements; a fuse cell to store configuration information for controlling the switching of memory elements in the plurality of memories; shift registers provided corresponding to the respective memories, which receive and retain the configuration information on the memories from the fuse cell; and control circuits for controlling the operations of the shift registers. Furthermore, the shift register includes: a shift portion for receiving configuration data and transferring the data to another shift register; and a latch portion for retaining the data inputted to the shift portion. The control circuit controls whether or not the data input to the shift portion of the shift register is to be retained in the latch portion.

In more detail, these control circuits are separately provided for a plurality of modules activated by causing power to be supplied from independent power sources formed on a chip of the microcomputer. Additionally, the control circuit controls in response to the switching on and off of the corresponding module whether or not the data input to the shift portion of the shift register in the module is to be retained in the latch portion. More specifically, the modules including the fuse cell transmit complete signals showing the completed transmission to the control circuits, after finishing the transmission of the configuration information. When receiving the complete signal, the control circuit causes the shift register not to capture the data input to the shift portion. Furthermore, the control circuit controls the shift register such that the data input to the shift portion can be captured in the latch portion, when a reset signal is output following the switching on and off of the corresponding module is received.

In addition, another aspect of the present invention to achieve the foregoing object can also be realized as the following microcomputer including a plurality of modules activated by causing power to be supplied from independent power sources. This microcomputer includes: memories provided in the plurality of modules, which have redundancy memory elements; a fuse cell storing configuration information for controlling the switching of the memory elements in the memories; a scan chain for propagating the configuration information stored in the fuse cell to the memories of the plurality of modules; and information retaining means for retaining the configuration information propagated by the scan chain, which is provided for each of the plurality of modules. Furthermore, the fuse cell transmits, to the scan chain, the configuration information in response to a reset operation in each module. The information retaining means of a specific module, which performed the reset operation in relation to the foregoing operation, inputs and retains the configuration information transmitted in response to the reset operation. Conversely, the information retaining means of another module is characterized by not retaining the configuration information which is transmitted in response to the reset operation of the specific module, and by retaining the configuration information when receiving the complete signal previously stored.

BRIEF DESCRIPTION OF THE DRAWINGS

For a more complete understanding of the present invention and the advantage thereof, reference is now made to the following description taken in conjunction with the accompanying drawings.

DETAILED DESCRIPTION OF THE PREFERRED EMBODIMENT

Hereinafter, with reference to the attached drawings, a detailed description will be given of a best mode for carrying out the present invention (hereinafter, referred to as a first embodiment).

According to a first embodiment, a scan chain for propagating configuration information to each memory on a SoC is implemented with shift registers (flip-flop circuits) including shift portions and latch portions with new configurations. Moreover, a control circuit for controlling the operations of the shift registers is provided in each domain (module) on the SoC to which voltage islands are applied. A control is achieved in a manner of writing the configuration information on the memories in a predetermined module alone (that is, without influencing another module) with such a configuration, when power is switched on from off in the module.

Figure 1:
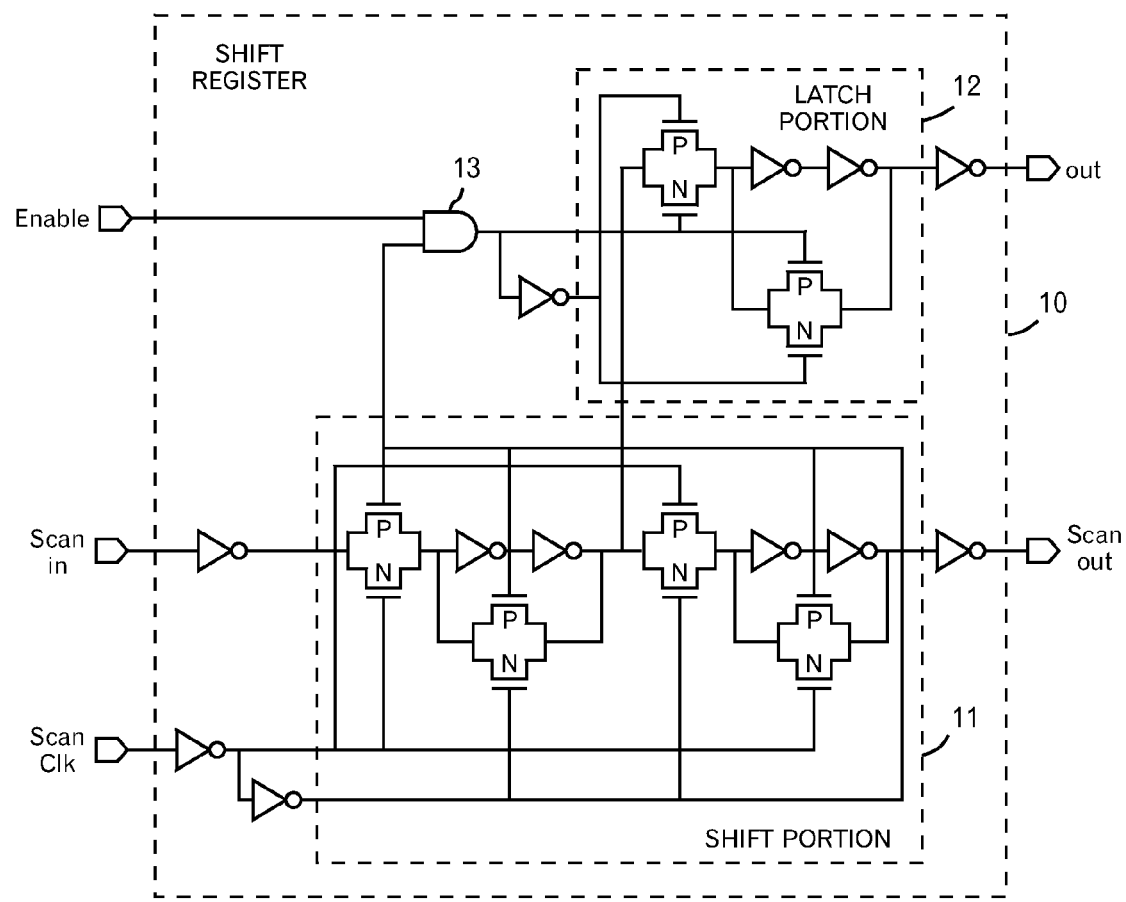
FIG. 1 is a view showing the circuit configuration of a shift register used in an embodiment.

FIG. 1 is a view showing a circuit configuration of the shift register according to a first embodiment.

Shift register 10 shown in FIG. 1 includes a shift portion 12 and a latch portion 11. Shift register 10 is provided for each memory on the SoC, and is used to propagate the configuration information for controlling the switching of memory elements.

Figure 9:
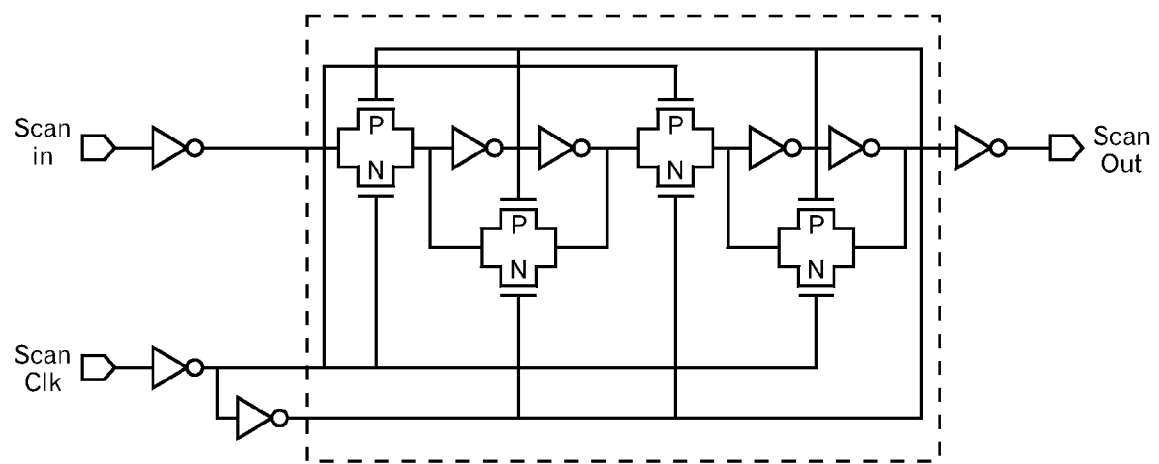
FIG. 9 is a view showing the circuit configuration of a shift register provided in a memory of the conventional SoC.
Figure 10:
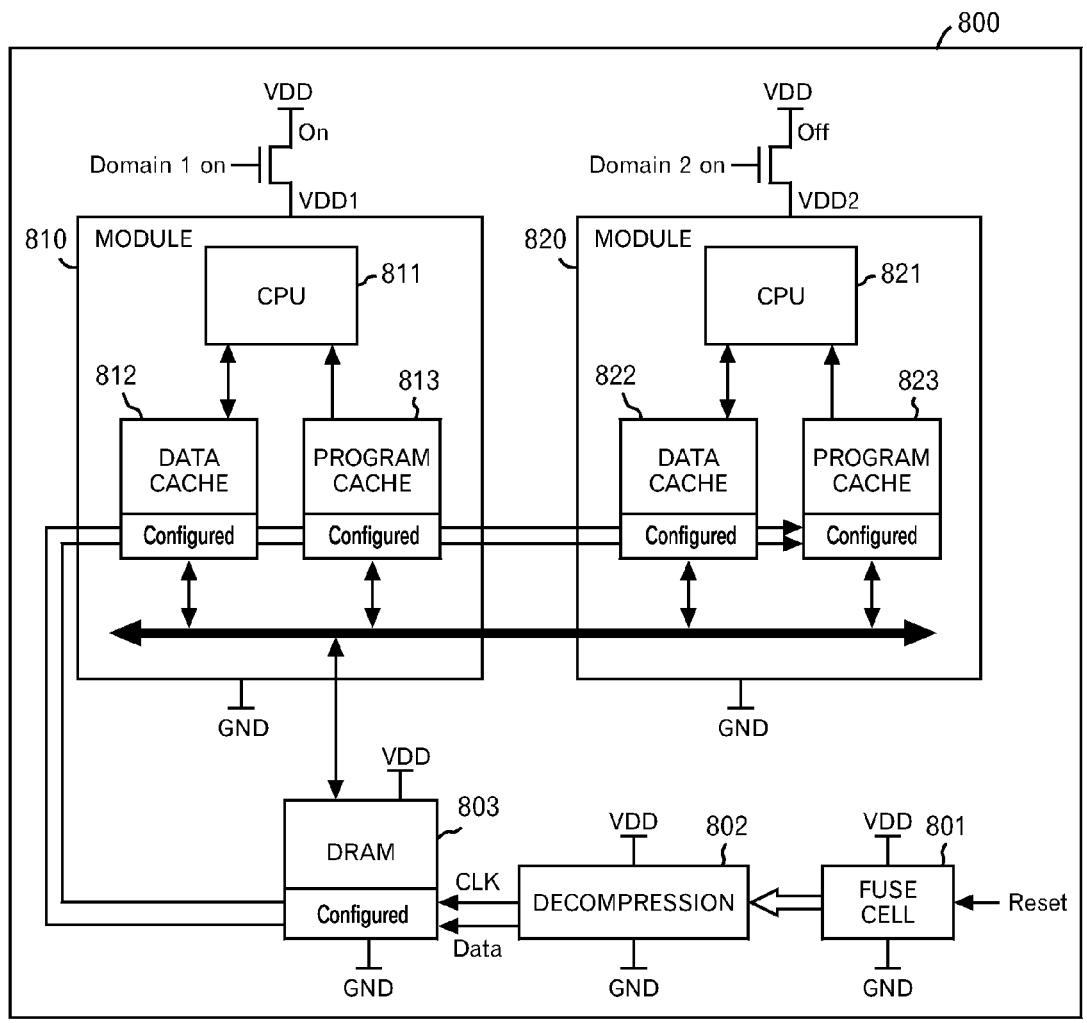
FIG. 10 is a view showing a state where the configuration of each memory is completed in the SoC of FIG. 8.
Figure 11:
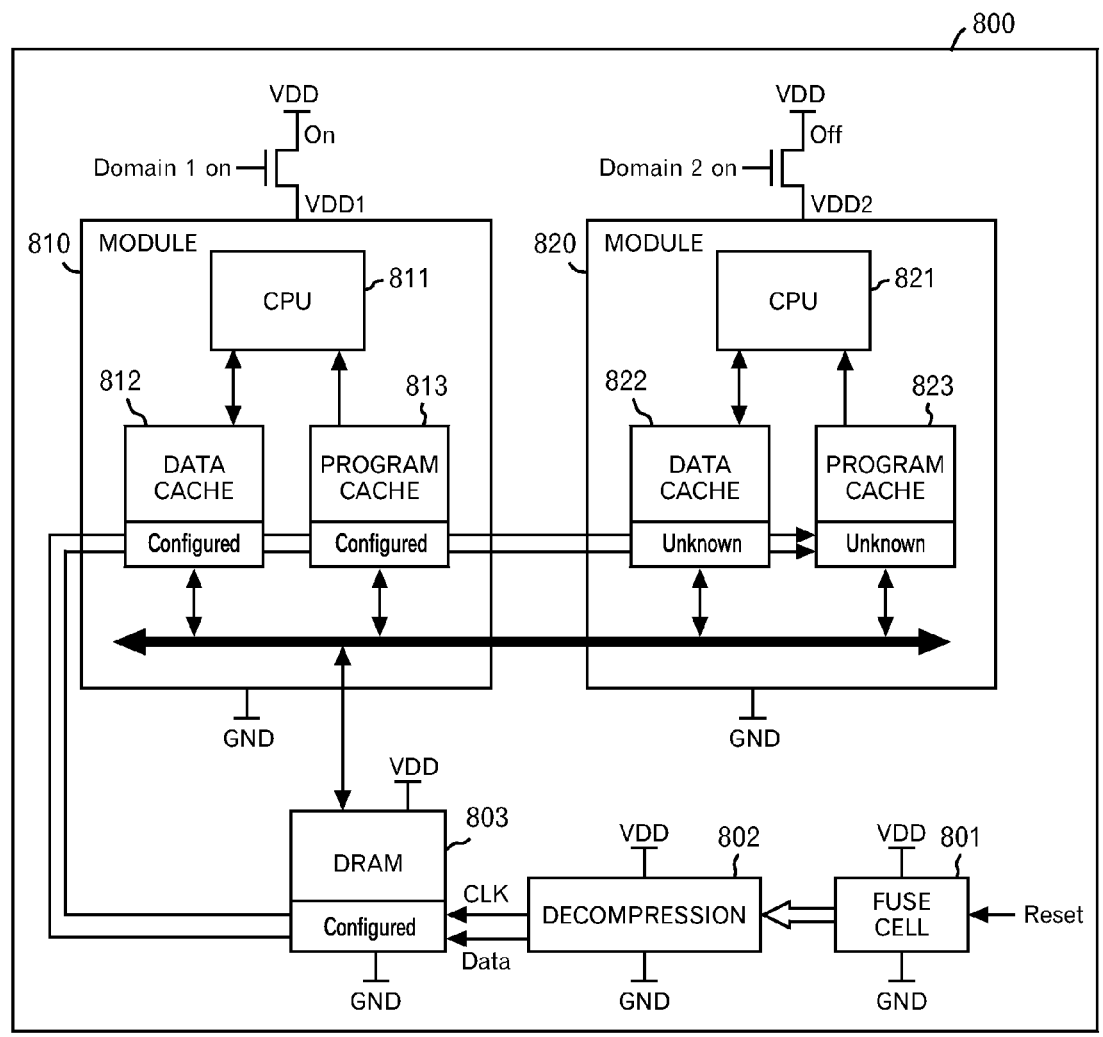
FIG. 11 is a view showing a state of a memory of when a specific module is turned off in the SoC of FIG. 10.

Shift portion 11 is a flip-flop circuit having the same configuration as that of a conventional shift register shown in FIG. 9. Shift portion 12 sequentially shifts to the latter part of the shift register 10 in a manner of synchronizing with a scan clock (Scan clk), and inputting data (configuration information) from a scan in (Scan in), and outputting the data from a scan out (Scan out).

The latch portion 12 is a flip-flop circuit for inputting and retaining the data inputted to the shift portion 11. In addition, a data input from the shift portion 11 is controlled in the latch portion 12 by use of an enable signal (Enable) to be described later. Since the enable signal and the scan clock are input to latch portion 12 through an AND circuit, when the value of the enable signal is "1", the data input to shift portion 11 is input also to latch portion 12 in accordance with the scan clock. Conversely, the data input to the shift portion 11 is not presented to the latch portion 12 when the value of the enable signal is "0", since the scan clock is not input to latch portion 12. Therefore, if the value of the enable signal is "0", even if predetermined data is propagated through the scan chain, the predetermined data just passes through shift portion 11. Thus, the previous data is retained in latch portion 12.

Figure 2:
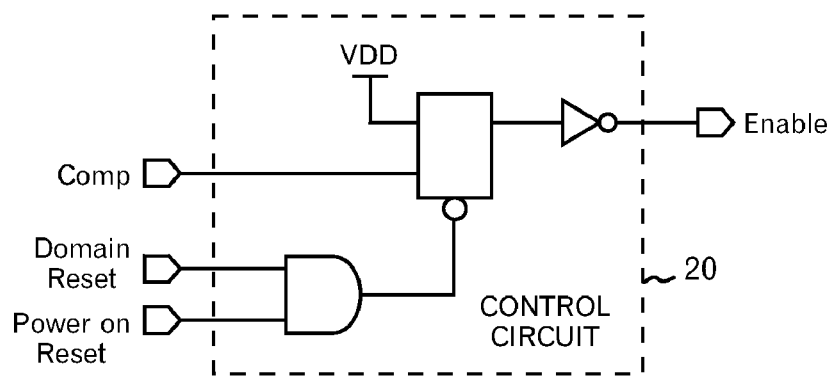
FIG. 2 is a view showing the circuit configuration of a control circuit used in the embodiment.

FIG. 2 is a view showing a circuit configuration of a control circuit for supplying an enable signal to and controlling the operations of shift register 10.

Control circuit 20 shown in FIG. 2 has a flip-flop circuit which is set by the input of a complete signal (Comp) and is reset by the input of a reset signal (Scan in or Scan clk). Furthermore, the value of the enable signal which is output when the complete signal becomes active is changed to "0", and the value of the enable signal is changed to "1" when the reset signal is input. Control circuit 20 is provided for each domain (module) of the voltage islands implemented on the SoC.

The complete signal is output from a fuse/decompression module of the SoC after finishing the transfer of the configuration information used for the configuration of a memory. Moreover, the reset signal input by control circuit 20 is a Power on Reset for the whole SoC, or is individual Power on Reset (Domain Reset) for a voltage domain where control circuit 20 exists.

Figure 3:
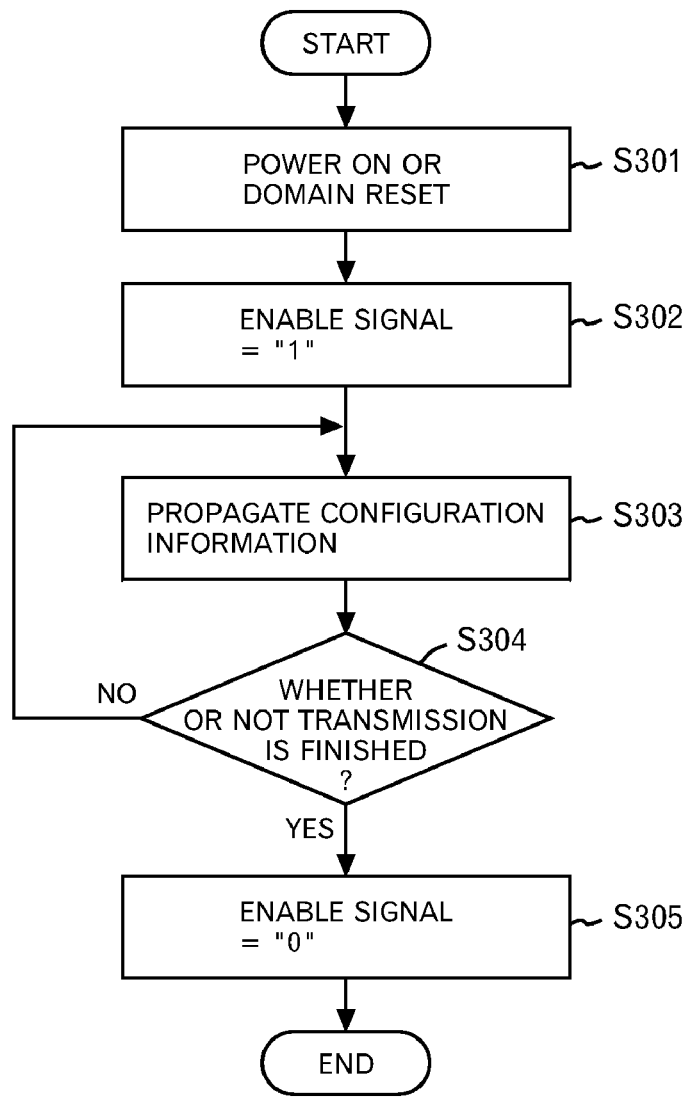
FIG. 3 is a flowchart explaining the operations of the shift register and the control circuit of the embodiment.

FIG. 3 is a flowchart explaining the operation of shift register 10 and control circuit 20, respectively.

With reference to FIG. 3, when an SoC 100 is turned on, or when an individual domain is reset (Step 301), the control circuit 20 makes the enable signal "1" in response to the reset signal (Step 302). Then, shift portion 11 of shift register 10 of each memory shifts configuration information while synchronizing with a scan clock (Step 303). At this point, latch portion 12 of each shift register 10 captures data input to shift portion 11. When finishing the transmission of the configuration information, a complete signal is output from decompression circuit 102 (Step 304). In response to the complete signal, control circuit 20 asserts the enable signal to "0" (Step 305).

Figure 4:
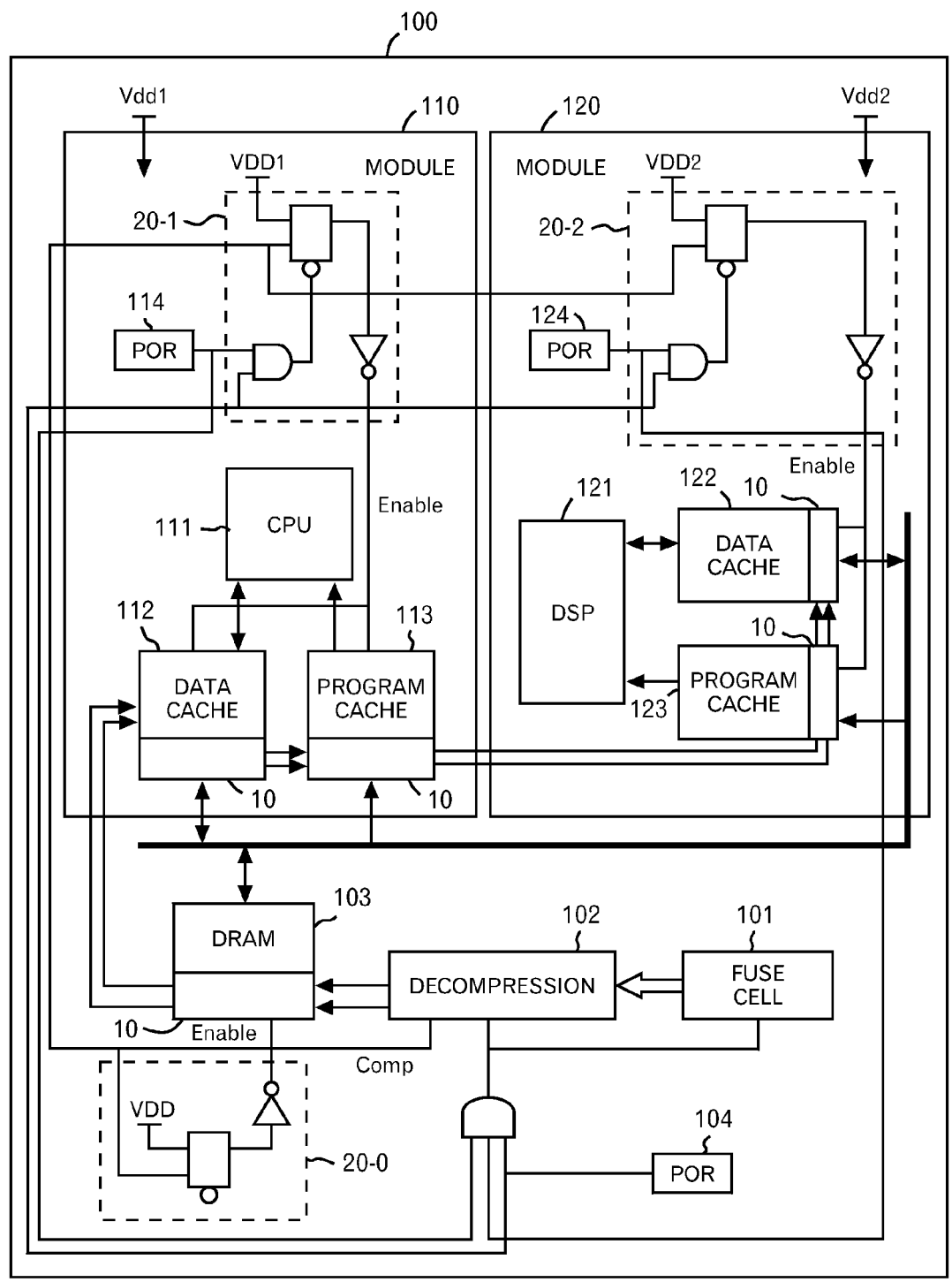
FIG. 4 is a view showing a configuration example of an SoC including the shift registers and the control circuits of the embodiment.

FIG. 4 is a view showing a configuration example of the SoC including register 10 and control circuit 20.

SoC 100 shown in FIG. 4 includes fuse cell 101, decompression circuit 102, DRAM 103 and two modules 110 and 120. DRAM 103 is supplied with power directly from power source VDD for the whole SoC 100. Modules 110 and 120 are supplied with power from independent power sources VDD1 and VDD2.

In FIG. 4, module 110 includes CPU 111, data cache 112 and program cache 113 as memories, and control circuit 20-1 (a subscript 1 is attached to the control circuit 20). Additionally, data cache 112 and program cache 113 are provided with shift registers 10, which are controlled by control circuit 20-1. Module 120 includes digital signal processor (DSP) 121, data cache 122 and program cache 123 as memories, and control circuit 20-2 (a subscript 2 is attached to the control circuit 20).

Further, data cache 122 and program cache 123 are provided with shift registers 10, which are controlled by control circuit 20-2. Moreover, DRAM 103 is also provided with shift register 10, which is controlled by an independent control circuit 20-0 (a subscript 0 is attached to the control circuit 20).

Shift registers 10 provided for the above-mentioned respective memories, are connected and configure a scan chain. Hence, as shown with arrows in the drawing, data transmitted from fuse cell 101 (the configuration information of each memory) is sequentially propagated from DRAM 103 to data cache 122 of module 120 through data cache 112 and program cache 113 of module 110 and program cache 123 of module 120, after being decompressed by the decompression circuit 102.

Decompression circuit 102 outputs complete signals (Comp) when having transmitted all data stored in fuse cell 101. The complete signals are supplied to control circuits 20-0, 20-1 and 20-2. Control circuits 20-0, 20-1 and 20-2 assert an enable signal for controlling shift register 10 to a "0", when receiving the complete signal.

In addition, SoC 100 is provided with reset signal output circuit (POR) 104 for outputting a reset signal (Power on Reset) by detecting that the power source VDD for the whole SoC 100 has been turned on. While module 110 is provided with reset signal output circuit (POR) 114 for outputting a reset signal (Domain Reset) by detecting that the power source VDD1 has been switched on from off in module 110 alone. Similarly, module 120 is provided with reset signal output circuit (POR) 124 for outputting a reset signal (Domain Reset) by detecting that power source VDD2 has been switched on from off in module 120 alone.

When a reset signal is output from any one of PORs 104, 114 and 124, a fuse/decompression module composed of fuse cell 101 and decompression circuit 102 receives the reset signal and transmits configuration information. Control circuit 20-0 receives the reset signal output from POR 104, thus asserting an enable signal for controlling shift register 10 to a "1" in response to the reset. When receiving any one of the reset signals output from POR 104 and the reset signal output from POR 114 of module 110, control circuit 20-1 asserts an enable signal for controlling the shift register 10 to a "1" in response to the reset. Similarly, when receiving any one of the reset signals output from POR 104 and the reset signal output from POR 124 of module 120, control circuit 20-2 asserts an enable signal for controlling the shift register 10 to a "1" in response to the reset.

In other words, the configuration information is transmitted, not only when power source VDD for the whole SoC is turned on, but also when power sources VDD1 and VDD2 are switched on from off in individual modules 110 and 120. In addition, in module 110, the configuration information propagated by the scan chain is captured in latch portion 12 of shift register 10 only when power source VDD for the whole SoC is turned on and when the power source VDD1 of module 110 is switched on from off. Similarly, in module 120, only when power source VDD for the whole SoC is turned on and when power source VDD2 of module 120 is switched on from off, the configuration information propagated by the scan chain is captured in latch portion 12 of shift register 10.

Put another way, in module 110, when a module other than module 110 is independently reset (i.e., when power source VDD2 of module 120 is switched on from off and a reset signal is output in the example of FIG. 4), the configuration information propagated by the scan chain flushes through shift portion 11 of shift register 10. Thus, the configuration information is not captured in latch portion 12. Similarly, in module 120, when a module other than module 120 is independently reset (i.e., when power source VDD1 of module 110 is switched on from off and a reset signal is output in the example of FIG. 4), the configuration information propagated by the scan chain flushes through shift portion 11 of shift register 10. Thus, the configuration information is not captured in latch portion 12.

In this manner, latch portion 12 of shift register 10 together with control circuit 20 function as the information retaining means, and shift portion 11 of shift register 10 operates as information transfer means for propagating the configuration information. Hereinafter, with reference to FIGS. 5 to 7, a description will be given of the specific operations of SoC 100 according to the first embodiment.

First, when power source VDD for entire SoC 100 is turned on, reset signals are output from POR 104, thus initializing the fuse/decompression module (fuse cell 101 and decompression circuit 102 in FIG. 4). Subsequently, the data stored in fuse cell 101 is decompressed by decompression circuit 102, and propagated to each memory (DRAM 103, data cache 112 and program cache 113 of module 110, and data cache 122 and program cache 123 of module 120) by the scan chain. Moreover, the reset signals output from POR 104 are input to control circuit 20-0, control circuit 20-1 of module 110 and control circuit 20-2 of module 120. Then, control circuits 20-0, 20-1 and 20-2 to which the reset signals are input asserts enable signals to a "1". Therefore, shift register 10 of each memory becomes able to retain, in latch portion 12, the data input to shift portion 11.

Figure 5:
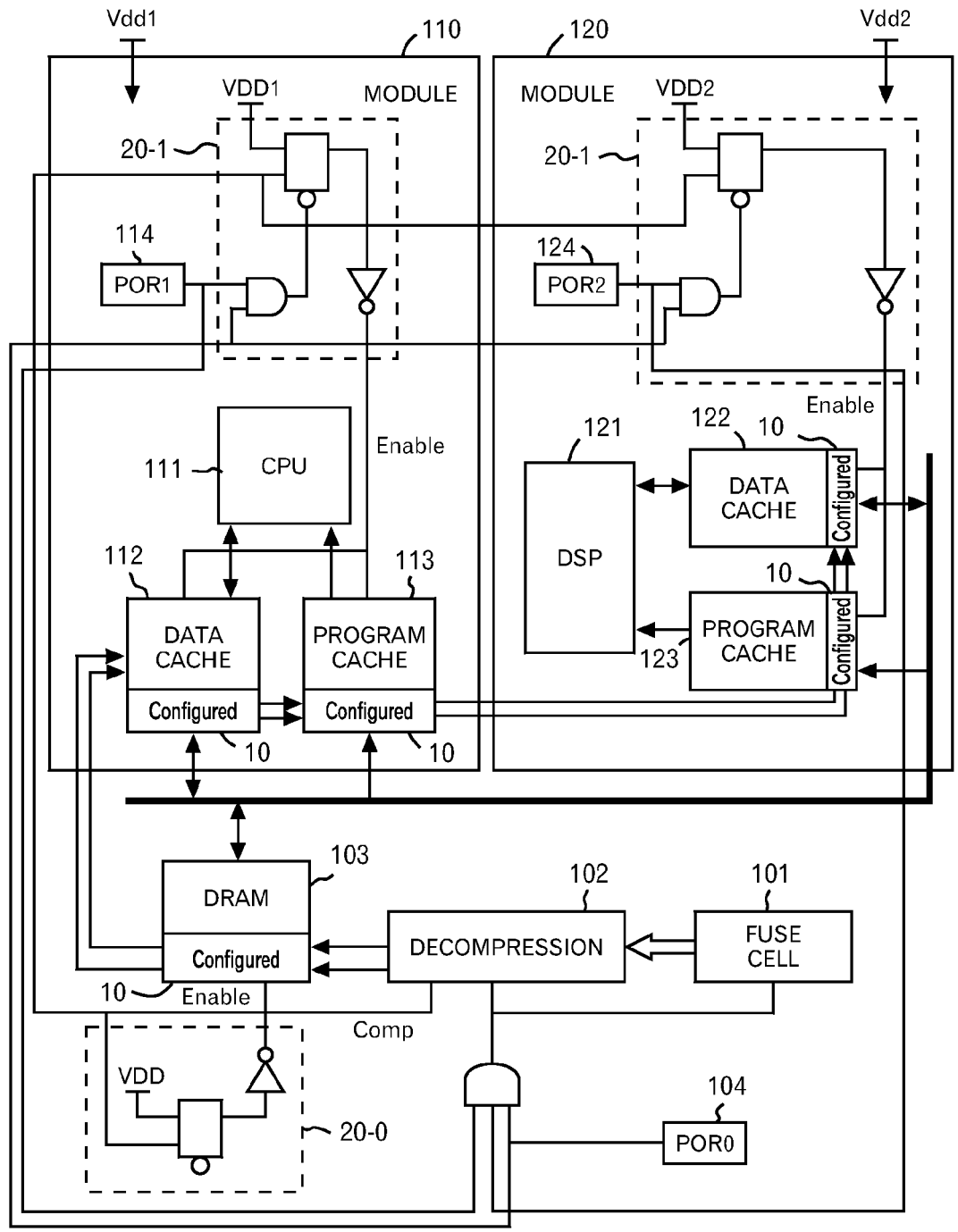
FIG. 5 is a view showing a state where the configuration of each memory is completed in the SoC of FIG. 4.

When finishing the transmission of the configuration information, shift register 10 of each memory on SoC 100 retains its respective configuration information in latch portion 12. Thereby, as shown in FIG. 5, the configuration of the memories is completed, and CPU 111 and DSP 121 enter a state where it is possible to access the memories in the respective modules 110 and 120. Note that a state where the configuration information is retained in the latch portion 12 of the shift register and the configuration of the memory is completed is described as "Configured" in the drawing.

In addition, with the finish of the transmission of the configuration information, complete signals are output from decompression circuit 102, thus transmitting the complete signals to control circuits 20-0, 20-1 and 20-2. Subsequently, control circuits 20-0, 20-1 and 20-2, which received the complete signals assert the enable signals to a "0". Hence, shift register 10 of each memory does not capture, in latch portion 12, data to be thereafter input to shift portion 11.

Figure 6:
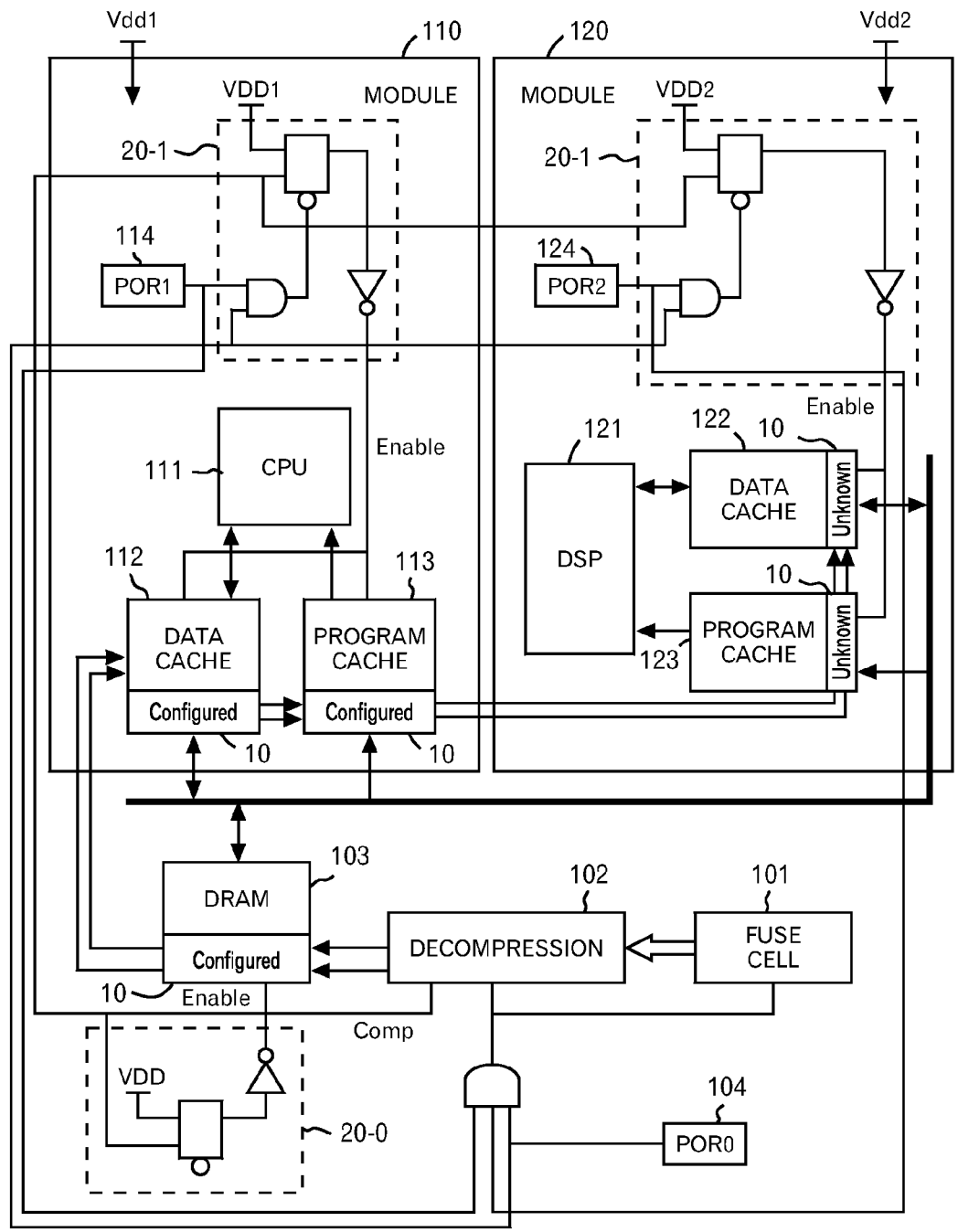
FIG. 6 is a view showing states of the memories of when a specific module is turned off in the SoC of FIG. 5.

Assume that the function of module 120 becomes unnecessary subsequent to turning on the power. Then, in order to reduce power consumption, power source VDD2 of module 120 is turned off. At this point, since the power supply is cut in module 120, the configuration information on data cache 122 and program cache 123 of module 120 is not retained as shown in FIG. 6. Note that a state where the configuration information is lost is described as "Unknown" in the drawing.

After that, assume that power source VDD 2 of module 120 is turned on again since an application using module 120 is executed. However, the configuration information on data cache 122 and program cache 123 of module 120 is lost. Hence, there is a need to propagate configuration information on the memories of module 120 again by the scan chain to use the memories.

For this reason, when power source VDD2 is turned on, a reset signal is output from POR 124 in module 120. The fuse/decompression module is initialized due to the reset signal, and the transmission of the configuration information is performed. On the other hand, this reset signal is received by control circuit 20-2 of module 120, thus asserting an enable signal of control circuit 20-2 to a "1". Therefore, shift registers 10 of data cache 122 and program cache 123 of module 120 are able to retain, in latch portion 12, data input to shift portion 11.

Figure 7:
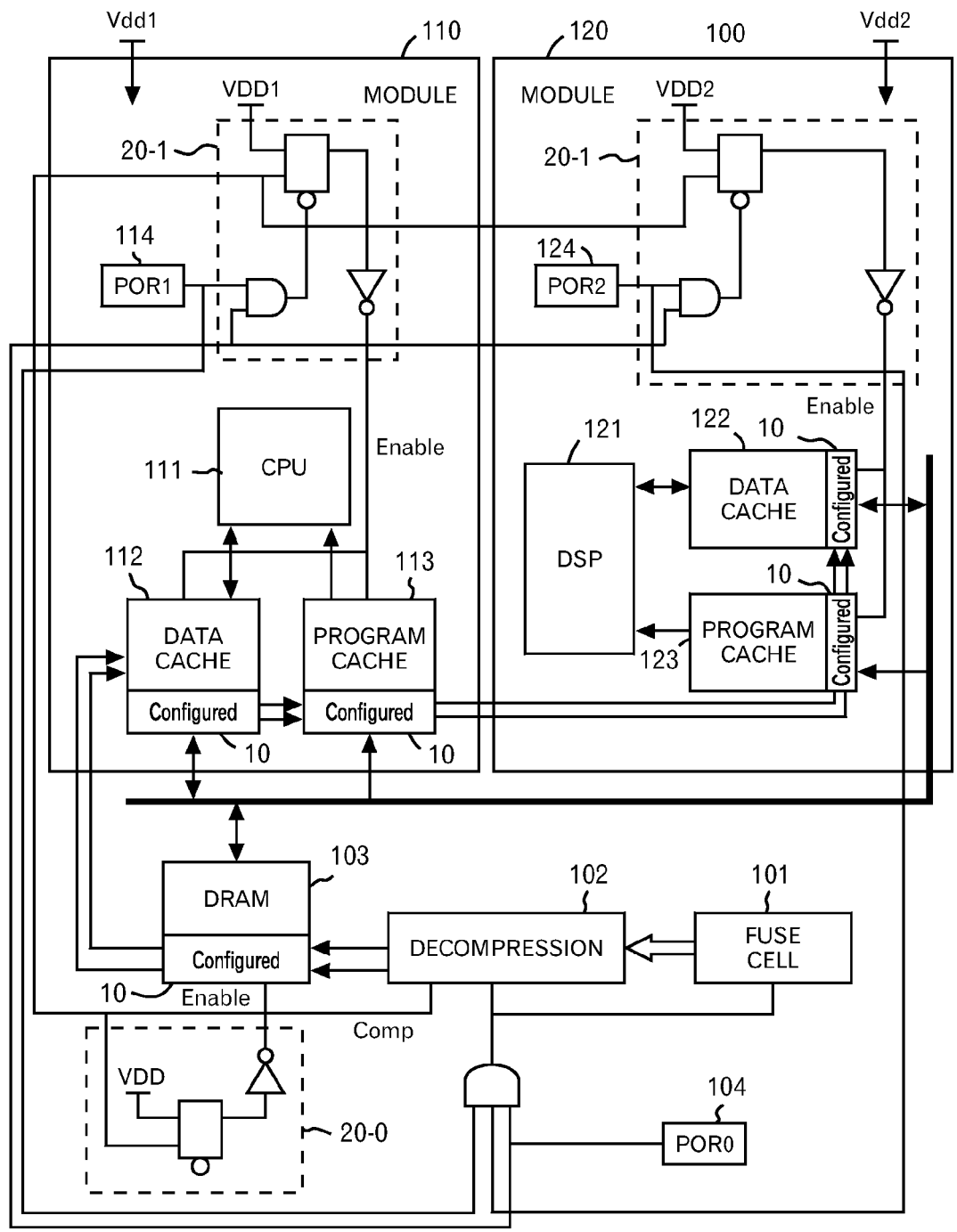
FIG. 7 is a view showing states of the memories of when the specific module is turned on again in the SoC of FIG. 6.
Figure 8:
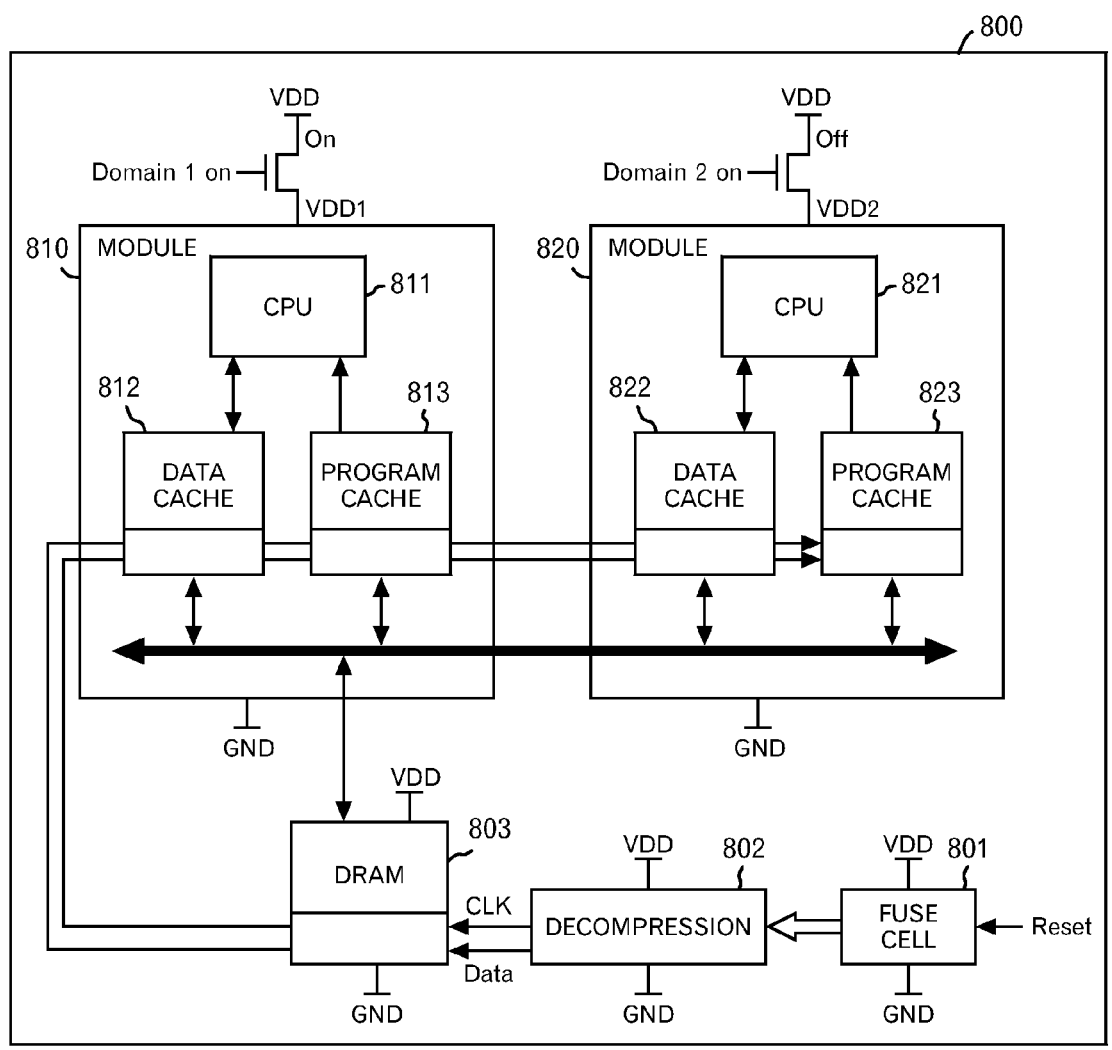
FIG. 8 is a view showing the configuration of a conventional SoC.

If finishing the transmission of the configuration information in this state, shift registers 10 of data cache 122 and program cache 123 retain, in latch portions 12, their respective configuration information input to shift portions 11 in module 120. Then, the configurations of the memories are completed as shown in FIG. 7.

Conversely, the enable signals of control circuits 20-0 and 20-1 remain "0" in DRAM 103 and data cache 112 and program cache 113 of module 110. Accordingly, even if any data is input to shift portions 11 of shift registers 10, the data is not captured in latch portions 12. Therefore, the configuration information transmitted this time just passes through shift portions 11, and the data retained in latch portions 12 is not rewritten. For this reason, for a period from when power source VDD2 of module 120 is turned on to when the configuration information is propagated and the configurations of data cache 122 and program cache 123 of module 120 are completed, CPU 111 of module 110 can access data cache 112, program cache 113 and DRAM 103 as usual.

The foregoing description is directed to a first embodiment. However, the circuit configuration of an actual SoC is not limited to the circuit configuration shown in FIG. 4, and also the configurations of shift register 10 and control circuit 20 are not limited to the configurations shown in FIGS. 1 and 2. Specific circuit configurations for alternative embodiments may employ appropriate configurations within a scope of the technical principles of the present invention.

According to the present invention configured as described above, a module in which the reset operation is performed by switching power on from off performs the memory configuration by capturing the configuration information output from the fuse cell and propagated by the scan chain, in a latch portion (storage means) of the shift register. On the other hand, in a module where the reset operation is not performed, the configuration information is not captured in the latch portion of the shift register, and passes through the shift portion. Therefore, since the configuration information is not rewritten in the module where the reset operation is not performed, an access operation to the memory is not prevented.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of providing memory redundancy across a plurality of voltage domains in an integrated control circuit, the method comprising:

providing a plurality of memories with redundancy memory elements;

storing memory configuration information in a fuse cell for controlling switching of memory elements in the plurality of memory elements;

retaining the configuration information of a corresponding memory from the fuse cell in a shift register;

controlling operations of the shift register, wherein
the shift register includes a shift portion which receives data of the configuration information and transfers the data to another shift register, and a latch portion which retains the data inputted to the shift portion, and
the control circuit controls whether or not the data inputted to the shift portion of the shift register is to be retained in the latch portion;
directing power to be supplied from an independent power source for a plurality of independent voltage domains; and
controlling whether or not the configuration data inputted to the shift portion of the shift register in a corresponding module is to be retained in the latch portion in response to turning on and off of one of the plurality of independent voltage domains.

2. The method according to claim 1, further comprising:
directing the shift register not to capture the data inputted to the shift portion in the latch portion after the configuration information is transmitted from the fuse cell.

3. The method according to claim 1, further comprising:
directing the shift register to capture the data inputted to the shift portion in the latch portion when receiving a reset signal outputted with turning power on and off in the corresponding module.

4. The method according to claim 1, further comprising:
configuring a scan chain for propagating the configuration information transmitted from the fuse cell with the plurality of shift registers corresponding to the plurality of memories.

* * * * *